US009601571B2

(12) United States Patent
Holland et al.

(10) Patent No.: US 9,601,571 B2
(45) Date of Patent: Mar. 21, 2017

(54) NANOWIRE FABRICATION METHOD AND STRUCTURE THEREOF

(71) Applicant: Taiwan Semiconductor Manufacturing Company Limited, Hsinchu (TW)

(72) Inventors: Martin Christopher Holland, Bertem (BE); Georgios Vellianitis, Heverlee (BE); Matthias Passlack, Huldenberg (BE)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/504,488

(22) Filed: Oct. 2, 2014

(65) Prior Publication Data

US 2016/0099312 A1    Apr. 7, 2016

(51) Int. Cl.
*H01L 29/06* (2006.01)
*H01L 29/20* (2006.01)
*H01L 21/02* (2006.01)

(52) U.S. Cl.
CPC ...... *H01L 29/0676* (2013.01); *H01L 21/0243* (2013.01); *H01L 21/0262* (2013.01); *H01L 21/02433* (2013.01); *H01L 21/02491* (2013.01); *H01L 21/02499* (2013.01); *H01L 21/02538* (2013.01); *H01L 21/02603* (2013.01); *H01L 21/02609* (2013.01); *H01L 21/02645* (2013.01); *H01L 21/02653* (2013.01); *H01L 29/20* (2013.01)

(58) Field of Classification Search
None
See application file for complete search history.

(56) References Cited

U.S. PATENT DOCUMENTS

| 6,108,360 | A | * | 8/2000 | Razeghi | B82Y 20/00 372/45.012 |
| 2003/0017626 | A1 | * | 1/2003 | Hilt | C30B 25/18 438/3 |
| 2004/0048409 | A1 | * | 3/2004 | Biwa | H01L 33/24 438/46 |
| 2004/0235274 | A1 | * | 11/2004 | Kurita | C30B 23/02 438/483 |
| 2006/0272572 | A1 | * | 12/2006 | Uematsu | C30B 25/18 117/84 |
| 2011/0266595 | A1 | * | 11/2011 | Hata | H01L 21/02381 257/190 |
| 2014/0374796 | A1 | * | 12/2014 | Adam | H01L 21/02538 257/190 |

(Continued)

*Primary Examiner* — Calvin Choi
*Assistant Examiner* — Xiaoming Liu
(74) *Attorney, Agent, or Firm* — Jones Day

(57) ABSTRACT

A method of providing an out-of-plane semiconductor structure and a structure fabricated thereby is disclosed. The method comprises acts of: providing a substrate defining a major surface; providing a template layer having a predetermined template thickness on the major surface of the substrate; forming a recess in the template layer having a recess pattern and a recess depth smaller than the template thickness; and epitaxially growing a semiconductor structure from the recess. A planar shape of the recess pattern formed in the template layer substantially dictates an extending direction of the semiconductor structure.

20 Claims, 5 Drawing Sheets

(56) References Cited

U.S. PATENT DOCUMENTS

2015/0249139 A1* 9/2015 Cheng ............... H01L 29/42392
438/504
2015/0279696 A1* 10/2015 Cohen ................. H01L 21/3247
257/76

* cited by examiner

ABSTRACT# NANOWIRE FABRICATION METHOD AND STRUCTURE THEREOF

TECHNICAL FIELD

The present invention relates generally to a method and structure of semiconductor structure fabrication, and, more particularly, to the fabrication of semiconductor nanowire structures.

BACKGROUND

Semiconductor nanowire structures possess beneficial characteristics suitable for numerous applications. Vertically extending nanowire structures of III-V compound semiconductor materials are of particular interest owing to their high electron mobility and direct band gap properties. However, conventional nanowire fabrication schemes often call for the use of semiconductor substrates of non-standard crystal orientations to resolve issues arising from orientation-dependency of the nanowire growth direction. The use of non-standard substrates generally increases costs. Moreover, the need for metal particles as catalysts in the conventional fabrication methods makes them less compatible with certain applications, such as complementary metal-oxide-semiconductor (CMOS) manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIG. 1 is a flow chart of a method of fabricating a semiconductor structure in accordance with embodiments of the instant disclosure.
Figure 1:
Figure 1:
Figure 1:
Figure 1:
Figure 1:

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor nanowires have received increased attention in recent years as promising nanotechnology building blocks due to their unique geometry and associated optical and electrical properties. Suitable areas of semiconductor nanowire employment may include photonics, electronics, nanoelectromechanical systems, and life sciences, covering a wide range of applications from solar cells, light emitting diodes, lasers, to transistors.

The term "nanowire (NW)" generally refers to nano-scaled 1-dimensional structures having a diameter in the order of nanometers (usually around 100 nm or less in diameter, while a length thereof is not limited) and where quantum mechanical effects start to play important roles, endowing these nanostructures interesting properties not observable in their corresponding bulk or 3-D counterparts. Moreover, while the word "wire" is widely used to reflect the thin and linear characteristics of these nanostructures, the actual cross-sectional profile of the NW may resemble that of a bar/column/beam of various regular/irregular geometric shapes.

The construction of NWs may generally be categorized into two types of approaches: the top-down approach, where a suitable bulk material is reduced down to a desired nano-scaled structure by methods that generally involve nanolithography; and the bottom-up approach, where one or more suitable material is selectively grown into a desired nano-scaled structure, usually through epitaxial growing techniques.

Compound semiconductor materials of group III and group V elements (referred to as III-V compound semiconductors hereinafter) are good candidates for forming transistors due to their high electron mobility and direct band gap properties. However, unlike bulk semiconductor material such as silicon, III-V compound semiconductors are difficult to obtain in bulk crystal forms. Therefore, III-V compound semiconductor films are often grown on other substrates instead. The growth of III-V compound semiconductor films on dissimilar substrates (often of elemental semiconductor materials, such as silicon) nevertheless poses difficulties because these substrates have lattice constants and thermal expansion coefficients different from that of the III-V compound semiconductors. This makes the construction of III-V compound NW through top-down approach less viable.

Conventional construction of III-V compound nanowires generally adopts the vapor-liquid-solid (VLS) mechanism, which typically involves the use of metallic particles (e.g., gold particles) as catalysts to facilitate one dimensional anisotropic single crystal growth of the III-V compound materials directly on a semiconductor substrate (typically a crystalline substrate such as a Si wafer). For instance, a liquid metal particle is heated in the presence of one or more semiconductor gas precursors. The metal particle acts as a preferential sink to collect semiconductor material from the surrounding vapor precursor. The material collection of the metal particle then becomes supersaturated, thereby precipitating the collected semiconductor material in the form of a 1-D NW structure on the semiconductor substrate.

However, the catalyst-promoted growth of NW structures under the VLS mechanism inevitably introduces additional variables into the equation, such as seed particle shapes/dimension variations. Such variables may impact the growth rate of individual NWs, thus making the fabrication of a large NW array with uniform height a daunting task to achieve. Also, the use of metal particles as seeding catalysts makes the VLS mechanism generally incompatible to certain field of application, such as CMOS manufacturing process.

Moreover, the growth/extending direction of a NW structure (particular of III-V compound material) on a crystalline substrate correlates strongly to the crystal orientation of an underlying surface thereof. For instance, a conventionally grown VLS NW usually extends preferentially in the <111> direction, which generally coincides with one of the slantwise out-of-plane directions of a common substrate (e.g., the widely used Si (001) substrate). The slantwise growing direction usually results in an out-of-plane angled NW structure, which is less favorable for general integration purposes.

Figure 4A:
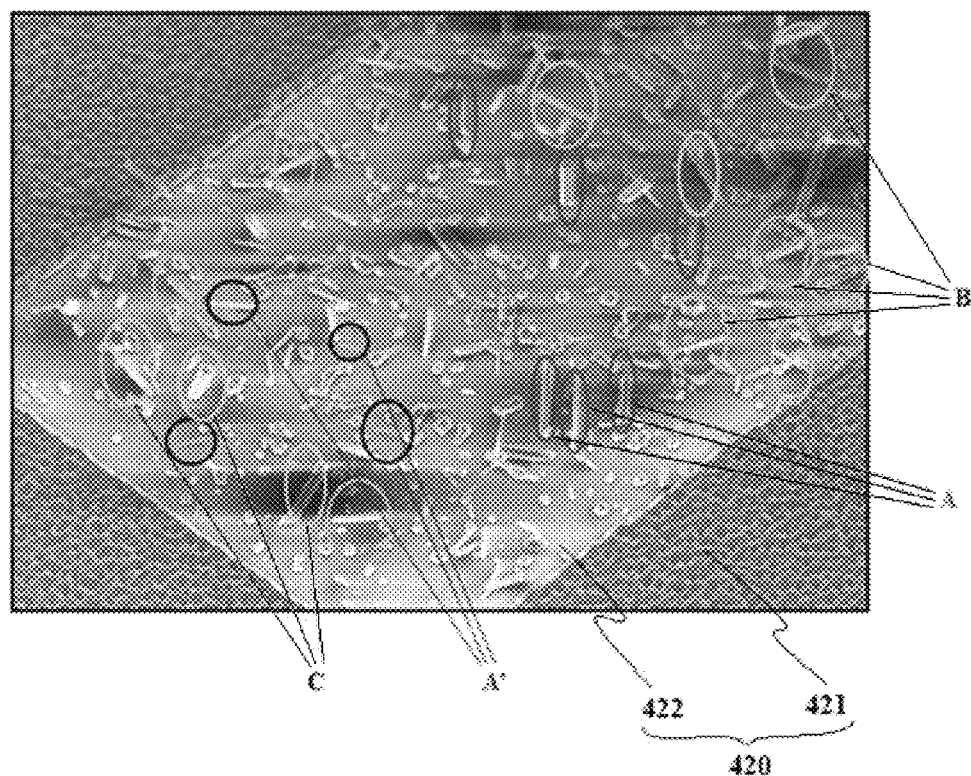
FIGS. 4A and 4B are local enlargement views showing various growth orientations of semiconductor structures, in accordance with some embodiments of the instant disclosure.

Referring to FIG. 4A, which illustrates a local enlargement view showing various growth orientations of semiconductor structures, in accordance with some embodiments of the instant disclosure. Specifically, an oxide layer 420 is formed on the surface of a substrate (covered and now shown) to provide a base for the NW structures to grow on. The oxide layer 420, as shown in the instant figure, comprises two regions: a first region 421 that comprises an unprocessed, texture-rich top surface, and a second region 422 that comprises a conditioned, flattened top surface, which serves as the growing site for a plurality NW structures (some of which are marked in circles).

While the surface of the second region 422 appears to be relatively flat and smooth compared to that of the first region 421 at the instant scale of viewing, the top surface thereof is nevertheless undulating with a plurality of non-observable recesses of different shapes. NW structures of different extension angles can be seen grown on the oxide layer 420. It is observed that, rather than exhibiting a crystal orientation dependency on the underlying substrate surface, the extension direction of NW structures on an amorphous surface (e.g., oxide layer) corresponds closely to the shapes of the recess from which they grow.

In the instant example, a typical III-V compound material with <111> crystal orientation (e.g., indium arsenide/InAs) is used to form the out-of-plane NW structures. Specifically, NW structures having four distinct types of extension direction can be observed. Particularly, some of each type of NWs are circled and labeled respectively as type "A/A'," "B," and "C". Type A NW structures appear to stand vertically on the underlying oxide layer. Type A' NW structure appears to be steeply inclined toward the oxide surface, forming a sharp acute angle there-between. Type B NW structure also extends slantingly from the oxide surface, but at a less acute angle than that of a type A' NW structure. Finally, type C NW structure extends tiltingly from the oxide layer surface, but including a largest angle there-between.

Figure 4B:
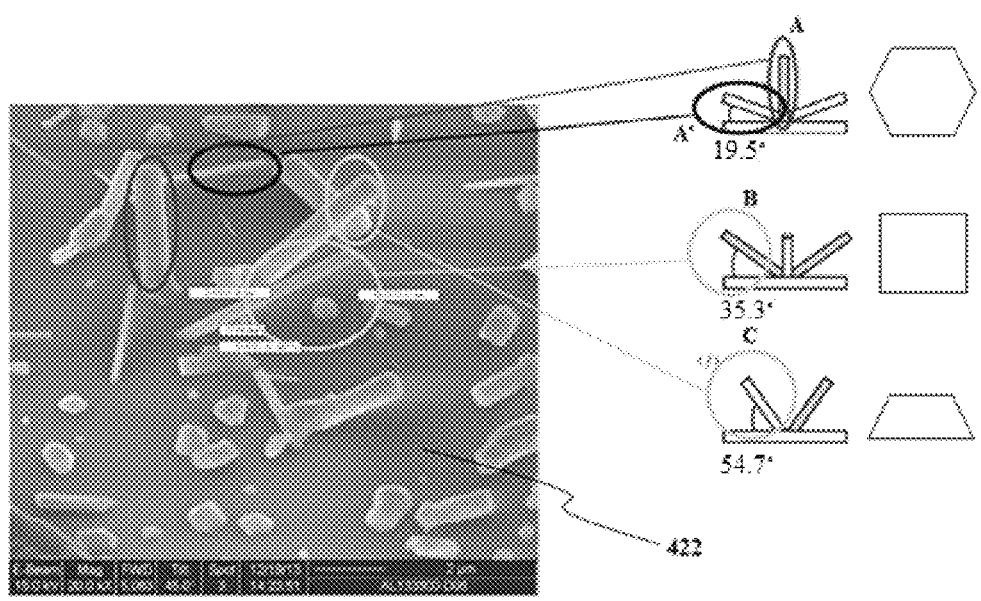

Referring to FIG. 4B, which illustrates a further enlargement view showing various growth orientations of semiconductor structures, in accordance with some embodiments of the instant disclosure. Specifically, the further enlarged view of FIG. 4B features at least one exemplary NW structure of each type of extension direction (marked in each one of the four circles), with corresponding diagrams provided on the right margin illustrating the respective included angles thereof. In addition, typical transverse cross-sectional profiles of each type the NW structures are also provided correspondingly. Particularly, NW structures at about 19.5°, about 35.3°, about 54.7°, and about 90° can be seen grown on the oxide surface of the second region 422. Among them, the type A NW structure typically comprises a hexagonal cross-section profile, and grows substantially perpendicularly from the underlying oxide surface. The type A' NW structure extends slantwise at a sharp acute angle of about 19.5°. The type B NW structure generally comprises a square cross-sectional shape and inclines at an include angle of about 35.3° with respect to the oxide surface. The type C NW structure has a typical cross-sectional profile of a trapezoid and forms an acute angle with the oxide layer at about 54.7°.

Referring to FIG. 1. FIG. 1 shows a flow chart of a method of fabricating the semiconductor structures shown in FIG. 4 in accordance with embodiments of the instant disclosure. Certain features of the disclosure will be discussed in detail in further Figures, but are referenced here for the reader's clarity after having read the entire disclosure. Particularly, the method in accordance with the instant disclosure utilizes a recess of a predetermined profile pattern on an amorphous material surface to provide a corresponding equivalent planar orientation, which leads to the growth of a subsequently disposed NW structure toward a particular desirable direction. Specifically, the flow chart of FIG. 1 shows a method 100 of providing an out-of-plane semiconductor structure. The method 100 comprises a process 110 in which a substrate (such as will be shown in 210 in FIGS. 2 and 420 in FIG. 4) having a major surface is provided; a process 120 in which a template layer (such as 220 in FIG. 2) having a predetermined template thickness is provided on the major surface of the substrate; a process 130 in which a recess (such as 221 in FIG. 2) having a recess pattern and a recess depth smaller than the template thickness is formed in the template layer; and a process 140 in which a semiconductor structure (such as 230 in FIG. 2) is epitaxially grown from the recess.

Prior to the epitaxial deposition of process 140, a process 131 may be provided to condition the recess in the template layer, thus flattening and smoothing a bottom surface thereof. A process 132 may be further provided to form a pre-layer (such as 222 in FIG. 2) of suitable material on the bottom surface of the recess before the epitaxial growth of the semiconductor structure.

Figure 2A:
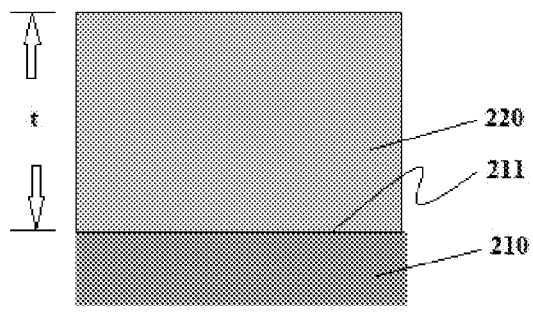
FIGS. 2A-E illustrate cross-sectional views of a semiconductor structure at various stages of fabrication in accordance with embodiments of the instant disclosure.

FIG. 2A illustrates a cross-sectional view of a semiconductor structure at one stage of fabrication in accordance with embodiments of the instant disclosure. Referring to FIG. 2A and processes 110 and 120 of FIG. 1. A substrate 210 having a major surface 211 defined thereon is provided as the basis for the formation of an out-of-plane extending semiconductor structure. A template layer 220 is provided on the substrate 210, covering at least a portion of the major surface 211 thereof. The template layer 220 comprises a non-crystalline material that does not exhibit regular surface orientations, and defines a thickness (t) above the major surface 211 of the substrate 210. Choice of material for the template layer 220 may include an amorphous dielectric such as oxide, nitride, glass material, and a suitable combination thereof. Suitable technique of template layer deposition may include chemical vapor deposition (CVD), plasma-enhanced chemical vapor deposition (PECVD), atomic layer deposition (ALD), plasma-assisted atomic layer deposition (plasma-assisted ALD), and the like. In some embodiments, the template layer 221 comprises an isolation region on a substrate, such as a shallow trench isolation (STI) feature. In some embodiments, the thickness (t) of the template layer 220 is substantially uniform across the coverage area thereof.

In some embodiments, the substrate 210 is a semiconductor bulk substrate selectively comprising, for example, Si, and Ge materials. In some embodiments, the substrate 210 comprises a silicon-on-insulator (SOI) structure, SiGe-on insulator (SiGeOI) or Ge on insulator (GeOI). In some embodiments, the substrate 210 may comprise a compound semiconductor including silicon carbide, gallium arsenide, gallium phosphide, indium phosphide, indium arsenide, and indium antimonide; an alloy semiconductor including SiGe, SiGeSn, GaAsP, AlInAs, AlGaAs, GaInAs, GaInP, and GaInAsP; other suitable materials; or combinations thereof.

Particularly, conventional formation of vertical NW structures from the III-V compound materials of <111> orientation (e.g., InAs) requires a substrate of non-standard crystal orientation (e.g., silicon (111) substrate). Particularly, using a standard silicon (001) substrate in such instance will result in the generation of slanting non-vertical NWs, which are less ideal for high density integration applications. In contrast, because the growth direction of a semiconductor NW structure on an amorphous surface is no longer dependent on the crystal orientation of the underlying substrate surface, the method and structure in accordance with the instant disclosure permit a substrate of virtually any crystal orientation to be used for the epitaxial growth of vertical NWs.

Figure 2B:
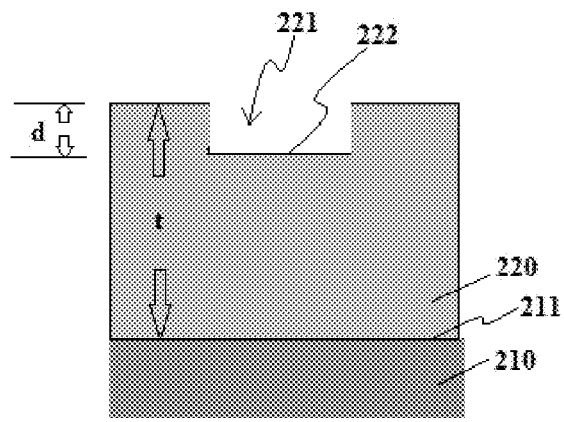

FIG. 2B illustrates a cross-sectional view of a semiconductor structure at one stage of fabrication in accordance with embodiments of the instant disclosure. Referring to FIG. 2B and process 130 of FIG. 1. A recess 221 is formed in the template layer 220. The recess 221 defines a recess pattern (not observable from the lateral view of the instant figure) and a recess depth (d), which is smaller than the template thickness (t). Moreover, the planar/cross-sectional profile of the recess 221 is substantially defined by surface 222 of the amorphous material in the template layer 220.

The instant figure is drawn to emphasize on the elevation contrast of the recess depth (d), and therefore may not be a pictorial reflection of the actual scale of the structure. Specifically, the recess 221 is formed to define an area of foundation for the subsequent deposition of a NW structure, and does not penetrate through the template layer 220. The blind-hole configuration of the recess 221 keeps the subsequent growth of the NW structure from being affected by the crystal orientation of the substrate 210. In some embodiments, sophisticated and well-developed lithographical techniques of current existence may be employed to define a desirable profile/pattern on the template layer 220 for the formation of the recess 221. Moreover, while the instant figure illustrates only one recess 221 in the template layer 220, in some embodiments, a plurality of recesses may be defined and formed on the surface of the template layer. In some embodiments, a large quantity of recesses may be patterned into an array for creating a NW structure array suitable for specific applications.

The recess pattern generally corresponds to a normal projection profile of the recess 221, which may comprise a geometrical shape such as a circle, a square, a hexagon, a trapezoid, a triangle, or the like. As an extension direction of a semiconductor NW structure on an amorphous surface generally correlates to a shape of a recess from which it grows, a recess pattern may be chosen to provide an equivalent planar orientation that correspondingly causes the NW structure to grow in a desired direction. In the instant example, a recess pattern is engineered to cause a substantially perpendicular growth direction for a subsequently disposed NW structure with respect to the major surface 211 of the substrate 210. A diameter of the recess pattern typically ranges from about 10 nm to about 100 nm, although wider or narrower values may also be adapted to suit particular design requirements.

Referring to FIG. 2B and process 131 of FIG. 1. An optional surface conditioning process may be performed to ensure the flatness and smoothness of the surface 222 in the template layer 220. Suitable techniques for the surface conditioning process may include an in-situ dry chemical cleaning process (e.g. SiCoNi) or a suitable wet etching process. The treatment may yield a generally flat and smooth surface 222 substantially parallel to the major surface 211 of the substrate 210, thereby providing a substantially uniform recess depth (d) in the template layer 220. In some embodiments, the recess depth ranges from about 1 nm to about 3 nm. Accordingly, there is generally no limitation as to the thickness of the template layer 220, as long as the thickness thereof is sufficient to support the formation of a non-penetrating/blind recess, such as recess 221.

Figure 2C:
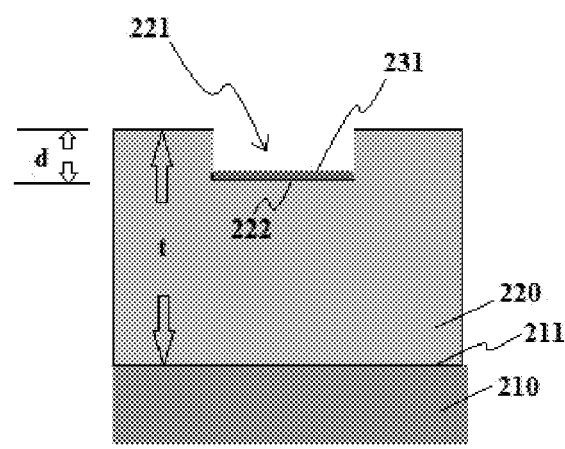

FIG. 2C illustrates a cross-sectional view of a semiconductor structure at one stage of fabrication in accordance with embodiments of the instant disclosure. Referring to FIG. 2C and process 132 of FIG. 1. A pre-layer 231 of suitable material is disposed on the surface 222 in preparation for a subsequent epitaxial deposition process for the growth of a semiconductor NW structure from the recess 221. For III-V compound materials, the pre-layer 231 may comprise at least one element of the group III materials, such as gallium (Ga), indium (In), and aluminum (Al) metals. The pre-layer 231 may be formed by employing a selective-area metal-organic chemical vapor deposition (MOCVD) technique, using one or more type of gaseous organometallic compound, such as trimethyl indium (TMIn), triethyl gallium (TEGa), trimethylgallium (TMGa), trimethyl aluminum (TMAl), tritertiarybutyl aluminum (TTBAl) and the like, as the group III material precursor.

Generally, a thin layer of group III material is sufficient for the pre-layer 231 to increase a range of growth conditions for a subsequent III-V compound NW formation process. In some embodiments, the pre-layer 231 comprises a thickness of about one monolayer. In some embodiments, the group III precursor is introduced into a MOCVD chamber at a flow rate of about 3 to about 200 standard cubic centimeter per second (sccm). In some embodiments, a flow time of metal-organic precursor is about 1 to about 50 seconds.

Figure 2D:
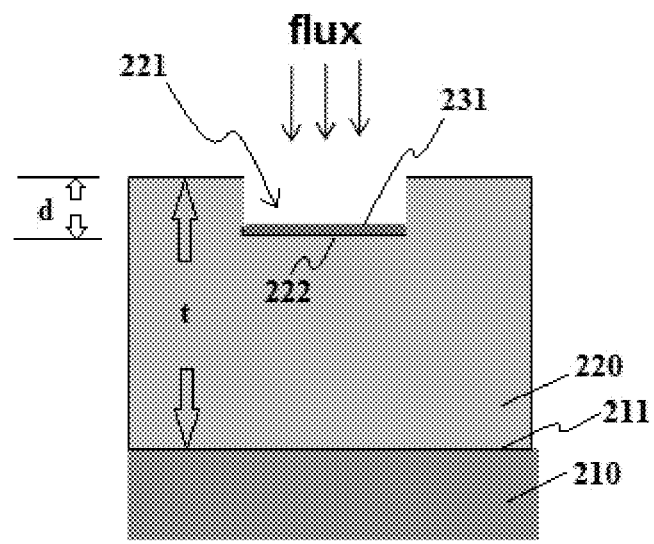

FIG. 2D illustrates a cross-sectional view of a semiconductor structure at one stage of fabrication in accordance with embodiments of the instant disclosure. Referring to FIG. 2D and process 140 of FIG. 1. Specifically, a selective area epitaxial growth process is performed to form a NW structure from the recess 221 of the template layer 220. In the instant embodiment, the MOCVD technique is employed, in which the template layer 220 on the substrate 210 is exposed to flux of suitable reactants (as illustrated by the downward pointing arrows), particularly at suitable locations (e.g., at the location of the recess 221). Typical group III materials for a III-V compound structure may include In, Ga, and Al, and suitable precursors thereof may include TMIn, TEGa, TMGa, TMAl, TTBAl, and the like.

Typical group V materials for a III-V compound structure may include arsenic (As), antimony (Sb), and bismuth (Bi), and suitable precursors thereof may include tributyl arsenic (TBA), arsine (AsH$_3$), phosphine (PH$_3$), tributyl phosphorus (TBP), trimethyl antimony (TMSb), triethyl antimony (TESb), and the like. In some embodiments, the group III precursor may be provided at a flow rate of about 3 sccm to about 200 sccm. In some embodiments, the group V precursor may be provided at a flow rate of about 20 sccm to about 500 sccm.

Figure 2E:
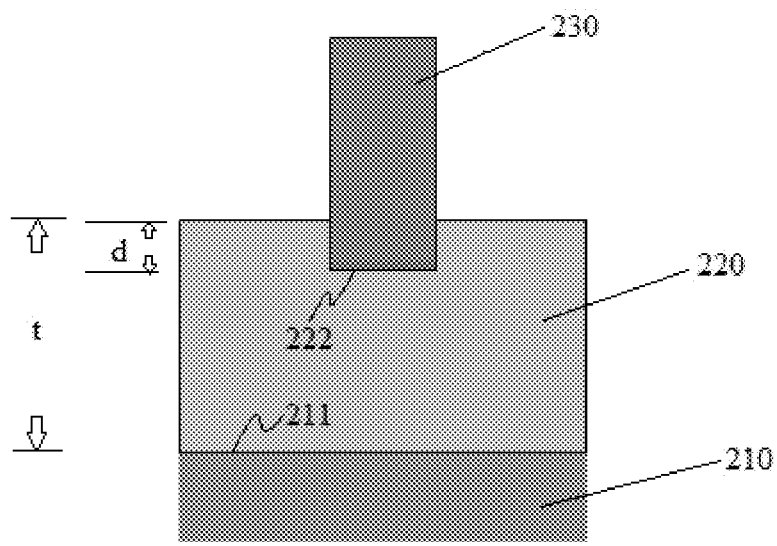

FIG. 2E illustrates a cross-sectional view of a semiconductor structure at one stage of fabrication in accordance with embodiments of the instant disclosure. Particularly, FIG. 2E shows a semiconductor structure 230 at a finalizing stage of a formation process. The selective area deposition of the III-V compound material may be performed until the growth of the semiconductor structure 230 reaches a desirable height above the underlying surface (e.g., an upward-facing surface of the template layer 220). In the instant embodiment, a recess pattern is chosen to provide a proper equivalent surface orientation on the template layer 220 that corresponds to the crystal orientation of the epitaxially disposed semiconductor material (e.g., InAs <111>), thereby yielding a semiconductor structure 230 that extends substantially vertically with respect to the major surface 211 of the underlying substrate 210.

Moreover, during the MOCVD process, the group III material of the pre-layer 231 (as shown in FIG. 2D) may be integrated into the subsequently disposed III-V compound material and incorporated as part of the semiconductor structure 230, and thus may no longer be visibly identifiable (therefore absent from FIG. 2E).

Figure 3A:
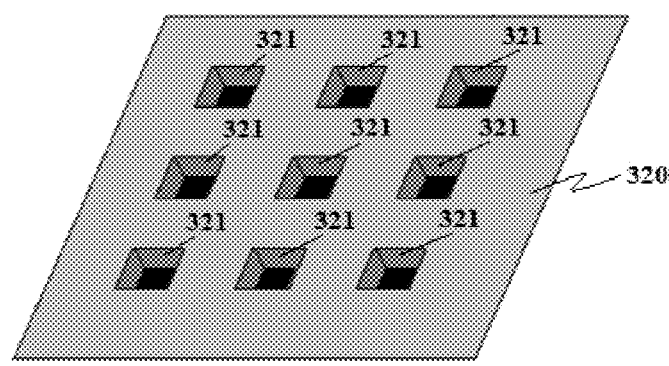
FIG. 3A illustrates an isometric view of a pattern array in a semiconductor structure at one stage of fabrication in accordance with embodiments of the instant disclosure.
Figure 3B:
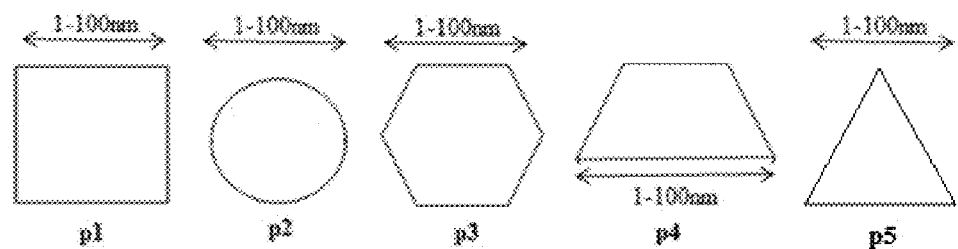
FIG. 3B illustrate cross-sectional profiles of the pattern array in FIG. 3A, in accordance with various embodiments of the instant disclosure.

FIG. 3A illustrates an isometric view of a pattern array in a semiconductor structure at one stage of fabrication in accordance with embodiments of the instant disclosure. FIG. 3B illustrate cross-sectional profiles of the pattern array in FIG. 3A, in accordance with various embodiments of the instant disclosure. Referring concurrently to FIGS. 3A and 3B. Specifically, FIG. 3A shows a plurality of recesses 321 defined and formed on a template layer 320, in accordance with some embodiments of the instant disclosure. Each of the recesses 321 may comprise a recess pattern, which generally corresponds to a normal projection profile thereof. Exemplary recess patterns may include a square pattern (p1), a circular pattern (p2), a hexagonal pattern (p3), a trapezoidal pattern (p4), and a triangular pattern (p5). Moreover, a diameter of a recess pattern typically ranges from about 1 nm to about 100 nm (as shown in FIG. 3B). Accordingly, for a recess depth of about 1 nm to about 3 nm in accordance with some embodiments of the instant disclosure, an aspect ratio (i.e., a ratio of a depth to a diameter) of the recess (e.g., recess 321) may be in the range of about 0.03 to about 0.1, although less or greater values may also be adapted to suit particular design requirements.

Accordingly, an array of NW structures may be provided utilizing a lithographically defined recess pattern array on an amorphous surface, in accordance with embodiments of the instant disclosure. As the extension direction of a semiconductor NW structure on an amorphous surface generally correlates to the shape of an underlying recess, a recess pattern (e.g., p1-p5) may be selected to affect the growth direction of a NW structure in a desirable manner. For integration purposes, vertically extending NW structures are often desired.

Tables 1 and 2 attached below provide some prophetic exemplary recess configuration conditions that would yield vertically extending NW structures. Referring to Table 1. Table 1 provides exemplary configuration conditions for the III-V zincblende compound semiconductors, which may include indium arsenide (InAs), gallium arsenide (GaAs), indium phosphide (InP), gallium antimonide (GaSb), aluminum antimonide (AlSb), aluminum arsenide (AlAs), aluminum phosphide (AlP), indium gallium arsenide (InGaAs), and indium aluminum arsenide (InAlAs). Use InAs for example, a recess that comprises a hexagonal pattern profile (e.g., p3 of FIG. 3B) or a circular pattern profile (e.g., p2 of FIG. 3B) may generate a vertically extending NW structure out of an InAs material with <111> crystal orientation. Likewise, a recess having a square pattern profile (e.g., p1 of FIG. 3B) may generate a vertically extending NW structure out of an InAs material with <001> crystal orientation, while a recess of a trapezoidal pattern profile (e.g., p4 of FIG. 3B) may generate a vertically extending NW structure out of an InAs material with <110> crystal orientation.

Referring to Table 2. Table 2 provides exemplary configuration conditions for the wurtzite compound semiconductors, which may include gallium nitride (GaN), zinc oxide (ZnO), cadmium sulfide (CdS), cadmium selenide (CdSe), silicon carbide (SiC), aluminum nitride (AlN), and boron nitride (BN). Use GaN for example, a recess that comprises a hexagonal pattern profile (e.g., p3 of FIG. 3B) may generate a vertically extending NW structure out of a GaN material with <0001> crystal orientation. Likewise, a recess comprising a triangular pattern profile (e.g., p5 of FIG. 3B) may generate a vertically extending NW structure out of a GaN material with <1010> crystal orientation, as well as a GaN material of <1120> crystal orientation.

TABLE 1

| Zincblende compound semiconductors | | |
| --- | --- | --- |
| III-V Nanowire Material | Recess Shape | Resultant Nanowire |
| InAs material of <111> orientation | Hexagon | Provides a (111) InAs plane, thus generates a vertical (90°) InAs NW (wires at 19.5° also possible) |
| InAs material of <111> orientation | Circular | Provides a (111) InAs plane, thus generates a vertical (90°) InAs NW (wires at 19.5° also possible) |
| InAs of <001> orientation | Square | Provides a (001) InAs plane, thus generates a vertical (90°) InAs NW (wires at 35.3° also possible) |
| InAs of <110> orientation | Trapezoid | Provides a (110) InAs plane, thus generates a vertical (90°) InAs NW (wires at 54.7° also possible) |

* Table above applicable to all zincblende compound semiconductors (e.g. GaAs, InP, GaSb, AlSb, AlAs, AlP, InGaAs, InAlAs).

TABLE 2

Wurtzite compound semiconductors

| III-V Nanowire Material | Recess Shape | Resultant Nanowire |
|---|---|---|
| GaN material of <0001> orientation | Hexagon | Provides a (0001) plane, thus generates a vertical (90°) GaN NW |
| GaN material of <10-10> orientation | Triangle | Provides a (10-10) plane, thus generates a vertical (90°) GaN NW |
| GaN material of <11-20> orientation | Triangle | Provides a (11-20) plane, thus generates a vertical (90°) GaN NW |

\* Table above applicable to all wurtzite compound semiconductors (e.g. GaN, ZnO, CdS, CdSe, SiC, AlN, BN).

Because the growth direction of a semiconductor NW structure on an amorphous surface no longer dependents on the crystal orientation of the underlying substrate surface, the method and structure in accordance with the instant disclosure permit the use of substrates of virtually any crystal orientation for the epitaxial growth of out-of-plane (and particularly, vertical) NW structures.

Accordingly, one aspect of the instant disclosure provides a method of providing an out-of-plane semiconductor structure, which comprises the acts of: providing a substrate defining a major surface; providing a template layer having a predetermined template thickness on the major surface of the substrate; forming a recess in the template layer having a recess pattern and a recess depth smaller than the template thickness; and epitaxially growing a semiconductor structure from the recess.

Accordingly, another aspect of the instant disclosure provides a method of providing an array of vertically extending semiconductor structures, which comprises the acts of: providing a substrate defining a major surface; providing a template layer having a predetermined template thickness on the major surface of the substrate; defining an array of predetermined patterns on the template layer to form an array of recesses in the template layer, each of the recesses having a recess depth smaller than the template thickness; and epitaxially growing a semiconductor structure from the recess. Moreover, a planar shape of the recess pattern formed in the template layer substantially dictates an extending direction of the semiconductor structure, and the recess patter is arranged to correspondingly cause the extending direction of the semiconductor structure to be substantially perpendicular to the major surface of the substrate.

Accordingly, one aspect of the instant disclosure provide a structure that comprises: a substrate having a major surface; a template layer disposed on the major surface of the substrate defining a template thickness; and a semiconductor structure that substantially vertically extends from the recess. The template layer comprises at least a recess defining a bottom surface. The recess comprises a recess pattern and a recess depth. The recess depth is smaller than the template thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of providing an out-of-plane semiconductor structure, comprising acts of:
   providing a substrate defining a major surface;
   providing a template layer having a predetermined template thickness and including a bottom surface and a surrounding surface that are made of the same material on the major surface of the substrate;
   forming a recess in the template layer having a recess pattern and a recess depth smaller than the template thickness and defined by the bottom surface and the surrounding surface of the template layer; and
   epitaxially growing a semiconductor structure, a portion of which is disposed in the recess, on the bottom surface of the template layer, the semiconductor structure extending in a substantially vertical direction with respect to the major surface of the substrate, the semiconductor structure having a generally uniform cross-section corresponding to the recess pattern.

2. The method of claim 1, wherein a planar shape of the recess pattern formed in the template layer substantially dictates an extending direction of the semiconductor structure.

3. The method of claim 1, wherein providing the template layer comprises depositing amorphous materials.

4. The method of claim 1, wherein the template layer selectively comprises an oxide material, a nitride material, glass material, and a combination thereof.

5. The method of claim 1, wherein the recess depth is substantially uniform and is about 1 nm to about 3 nm.

6. The method of claim 1, wherein the aspect ratio of the recess is about 0.03 to about 0.1.

7. The method of claim 1, further comprising conditioning the recess in the template layer to flatten the bottom surface of the template layer, thereby making the bottom surface of the template layer substantially parallel to the major surface of the substrate.

8. The method of claim 1, further comprising forming a pre-layer on the bottom surface of the template layer before epitaxially growing the semiconductor structure on the bottom surface of the template layer.

9. The method of claim 8, wherein forming the pre-layer includes depositing a group III material.

10. The method of claim 8 wherein forming the pre-layer is such that a thickness of the pre-layer is about 1 monolayer.

11. The method of claim 1, wherein epitaxially growing the semiconductor structure comprises a metal-oxide chemical vapor deposition (MOCVD) process that utilizes precursors comprising group III and group V materials.

12. The method of claim 11, wherein the group III material selectively comprises TMIn, TEGa, TMGa, TMAl, TTBAl, and a combination thereof; wherein the group V material selectively comprises TBA, AsH3, PH3, TBP, TMSb, TESb, and a combination thereof.

13. The method of claim 1, wherein the recess pattern is one of hexagonal, circular, square, trapezoidal, and triangular profile, wherein the extending direction of the semiconductor structure is substantially perpendicular to the major surface of the substrate.

14. A method comprising:
    providing a substrate;
    forming on a major surface of the substrate a template layer such that a surrounding surface of the template layer includes an amorphous material; and epitaxially growing a nanowire on a bottom surface of the template layer such that the nanowire is surrounded by the surrounding surface of the template layer, the nanowire extending in a substantially vertical direction with respect to the major surface of the substrate, the nanowire having a generally uniform cross-section corresponding to a shape of the nanowire on the bottom surface of the template layer.

15. A method comprising:

providing a substrate;

forming a recess defined by a bottom surface and a surrounding surface that is made of the same material as the bottom surface; and epitaxially growing a nanowire on the bottom surface and surrounded by the surrounding surface, wherein a predetermined cross-sectional profile of the surrounding surface and a predetermined crystal orientation of the nanowire cause an extending direction of the nanowire to be substantially perpendicular to a major surface of the substrate independent of a crystal orientation of the substrate, the nanowire having a generally uniform predetermined cross-sectional profile corresponding to a shape of recess.

16. The method of claim 15, wherein the predetermined crystal orientation is <111> and the predetermined cross-sectional profile is one of hexagonal and circular.

17. The method of claim 15, wherein the predetermined crystal orientation is <001> and the predetermined cross-sectional profile is square.

18. The method of claim 15, wherein the predetermined crystal orientation is <110> and the predetermined cross-sectional profile is trapezoidal.

19. The method of claim 15, wherein the predetermined crystal orientation is <0001> and the predetermined cross-sectional profile is hexagonal.

20. The method of claim 15, wherein the predetermined crystal orientation is one of <10-10> and <11-20> and the predetermined cross-sectional profile is triangular.

* * * * *